US009882548B2

United States Patent
Takamine

(10) Patent No.: US 9,882,548 B2
(45) Date of Patent: Jan. 30, 2018

(54) SPLITTER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 131 days.

(21) Appl. No.: 15/152,693

(22) Filed: May 12, 2016

(65) Prior Publication Data

US 2016/0261249 A1    Sep. 8, 2016

Related U.S. Application Data

(63) Continuation of application No. PCT/JP2014/080898, filed on Nov. 21, 2014.

(30) Foreign Application Priority Data

Nov. 29, 2013  (JP) .................. 2013-247493

(51) Int. Cl.

| | |
|---|---|
| *H04L 5/14* | (2006.01) |
| *H03H 9/70* | (2006.01) |
| *H03H 9/72* | (2006.01) |
| *H04B 1/50* | (2006.01) |
| *H03H 9/56* | (2006.01) |
| *H04B 1/00* | (2006.01) |
| *H03H 9/00* | (2006.01) |

(Continued)

(52) U.S. Cl.
CPC ............ *H03H 9/706* (2013.01); *H03H 9/562* (2013.01); *H03H 9/64* (2013.01); *H03H 9/6483* (2013.01);
(Continued)

(58) Field of Classification Search
CPC .......... H03H 9/706; H03H 9/562; H03H 9/64; H03H 9/6483; H03H 9/725; H04B 1/50
USPC ....................................... 370/276
See application file for complete search history.

(56) References Cited

U.S. PATENT DOCUMENTS

| | | | |
|---|---|---|---|
| 6,995,634 B2 * | 2/2006 | Iwashita | ............ H03H 9/02574 |
| | | | 310/313 A |
| 2004/0155730 A1 | 8/2004 | Iwamoto et al. | |

(Continued)

FOREIGN PATENT DOCUMENTS

| | | |
|---|---|---|
| JP | 2003-249842 A | 9/2003 |
| JP | 2010-515298 A | 5/2010 |

(Continued)

OTHER PUBLICATIONS

Ericsson; "Feasiblity for Support of Different Bands for Dual-Cell HSDPA"; TSG-RAN WG4 Meeting #50bis; R4-091271; Mar. 23-27, 2009; 5 pages.

(Continued)

*Primary Examiner* — Chi H Pham
*Assistant Examiner* — Alexander O Boakye
(74) *Attorney, Agent, or Firm* — Keating & Bennett, LLP

(57) ABSTRACT

In a splitter, a first duplexer including a first transmit filter and a first receive filter at a first antenna terminal and a second duplexer including a second transmit filter and a second receive filter at a second antenna terminal are connected to each other. A second transmit band of the second transmit filter and a second receive band of the second receive filter are positioned in a frequency range between a first transmit band of the first transmit filter and a first receive band of the first receive filter. Each of the second transmit filter and the second receive filter of the second duplexer includes an elastic wave filter. The elastic wave filter includes a high acoustic velocity film defining a high acoustic velocity member, a low acoustic velocity film through which transversal waves propagate at a lower velocity than those propagating through the high acoustic velocity film, a piezoelectric film disposed on the low acoustic velocity film, and IDT electrodes disposed on the piezoelectric film, which are stacked on each other in this order.

15 Claims, 6 Drawing Sheets

(51) Int. Cl.
*H03H 9/02* (2006.01)
*H03H 9/64* (2006.01)

(52) U.S. Cl.
CPC .......... *H03H 9/725* (2013.01); *H04B 1/0057* (2013.01); *H04B 1/50* (2013.01); *H03H 9/0009* (2013.01); *H03H 9/0014* (2013.01); *H03H 9/02574* (2013.01); *H03H 9/6476* (2013.01)

(56) References Cited

U.S. PATENT DOCUMENTS

| | | |
|---|---|---|
| 2008/0151790 A1 | 6/2008 | Lee et al. |
| 2012/0230228 A1 | 9/2012 | Oka et al. |
| 2013/0285768 A1 | 10/2013 | Watanabe et al. |
| 2014/0218128 A1* | 8/2014 | Fujita .................. H03H 9/725 333/133 |

FOREIGN PATENT DOCUMENTS

| | | | |
|---|---|---|---|
| JP | 2011-119981 A | 6/2011 | |
| JP | 2012-34049 A | 2/2012 | |
| WO | 2012/086639 A1 | 6/2012 | |
| WO | 2012/129550 A1 | 9/2012 | |

OTHER PUBLICATIONS

Official Communication issued in International Application PCT/JP2014/080898, dated Feb. 17, 2015.

* cited by examiner

SPLITTER

BACKGROUND OF THE INVENTION

1. Field of the Invention

The present invention relates to a splitter connected to an antenna terminal used in, for example, a mobile communication terminal, and more particularly, to a splitter that performs transmission and reception in multiple communication systems.

2. Description of the Related Art

It has been desired in, for example, cellular phones, that transmission or reception be performed at the same time by using multiple frequency bands. An example of a communication terminal to achieve this purpose is disclosed in Japanese Unexamined Patent Application Publication No. 2011-119981. In Japanese Unexamined Patent Application Publication No. 2011-119981, in order to transmit or receive signals at the same time in multiple frequency bands, plural duplexers are connected to an antenna terminal.

However, in a configuration in which plural duplexers are connected to an antenna terminal as disclosed in Japanese Unexamined Patent Application Publication No. 2011-119981, if transmission or reception is performed at the same time in multiple frequency bands, loss may be increased. For example, if transmission or reception is performed at the same time by using Band4 and Band25, which are communication standards used in North America, a considerable loss is incurred in Band4. If the same antenna terminal is used for plural duplexers or filters, such as for multiplexers for Band25 and Band4, it is necessary to set the impedance in the Band4 range at the antenna terminal of Band25 to be as open (infinite) as possible. The imaginary part of the impedance is adjustable by a matching element, but the real part of the impedance is influenced by loss components of the device itself or the matching element. More specifically, as the impedance characteristics in the Band4 range at the antenna terminal of Band25, a curve indicating the impedance in the Smith chart is required to be as close as possible to the outer peripheral edge. In a known SAW duplexer, however, there is a considerable leakage from bulk portions of surface acoustic waves, thereby causing a considerable loss. Accordingly, the curve indicating the impedance in the Band4 range at the antenna terminal is positioned toward inward in the Smith chart. Hence, if the known SAW duplexer is formed into a multiplexer, the loss becomes even greater.

SUMMARY OF THE INVENTION

Preferred embodiments of the present invention provide a splitter that performs transmission and reception at the same time in multiple communication systems while decreasing the loss.

A splitter according to a preferred embodiment of the present invention includes a first duplexer including a first antenna terminal connected to an antenna, a first transmit filter connected to the first antenna terminal and having a first transmit band, and a first receive filter having a first receive band; and a second duplexer including a second antenna terminal connected to the antenna, a second transmit filter connected to the second antenna terminal and having a second transmit band, and a second receive filter having a second receive band. The second transmit band and the second receive band are positioned in a frequency range between the first transmit band and the first receive band. Each of the second transmit filter and the second receive filter of the second duplexer includes an elastic wave filter. The elastic wave filter includes a high acoustic velocity member through which bulk waves propagate at a higher acoustic velocity than elastic waves propagating through a piezoelectric film, a low acoustic velocity film which is stacked on top of the high acoustic velocity member and through which bulk waves propagate at a lower acoustic velocity than bulk waves propagating through the piezoelectric film, the piezoelectric film stacked on top of the low acoustic velocity film, and an IDT electrode stacked on top of the piezoelectric film.

In a specific preferred embodiment of a splitter according to the present invention, the high acoustic velocity member may be a high acoustic velocity film. The splitter may further include a support substrate on top of which the high acoustic velocity film is stacked.

In another specific preferred embodiment of a splitter according to the present invention, the high acoustic velocity member may be a high acoustic velocity support substrate.

In still another specific preferred embodiment of a splitter according to the present invention, when a frequency difference between the first transmit band and the second transmit band is represented by $\Delta f1$ and when a frequency difference between the second receive band and the first receive band is represented by $\Delta f2$, $\Delta f1$ may be greater than about 1% of a lower limit frequency of the second transmit band, and $\Delta f2$ may be greater than about 1% of an upper limit frequency of the second receive band. In this case, in the second duplexer, the reflectance of signals in the first transmit band and in the first receive band is enhanced more effectively, thus making it possible to further decrease the loss.

In yet another specific preferred embodiment of a splitter according to the present invention, the first and second transmit filters may be ladder circuit filters, and the first and second receive filters may be longitudinally coupled resonator-type elastic wave filters.

In yet another specific preferred embodiment of a splitter according to the present invention, the first duplexer may be a Band4 duplexer, and the second duplexer may be a Band25 duplexer.

In a splitter according to a preferred embodiment of the present invention, the first transmit band, the first receive band, the second transmit band, and the second receive band satisfy the above-described relationships, and the second duplexer has the above-described specific configuration. Accordingly, the loss in the first duplexer is decreased. Thus, even in a case in which the frequency difference between the first transmit band and the second transmit band and the frequency difference between the second receive band and the first receive band are small, it is possible to decrease the loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified with reference to the drawings through illustration of specific preferred embodiments of the present invention.

Figure 2:
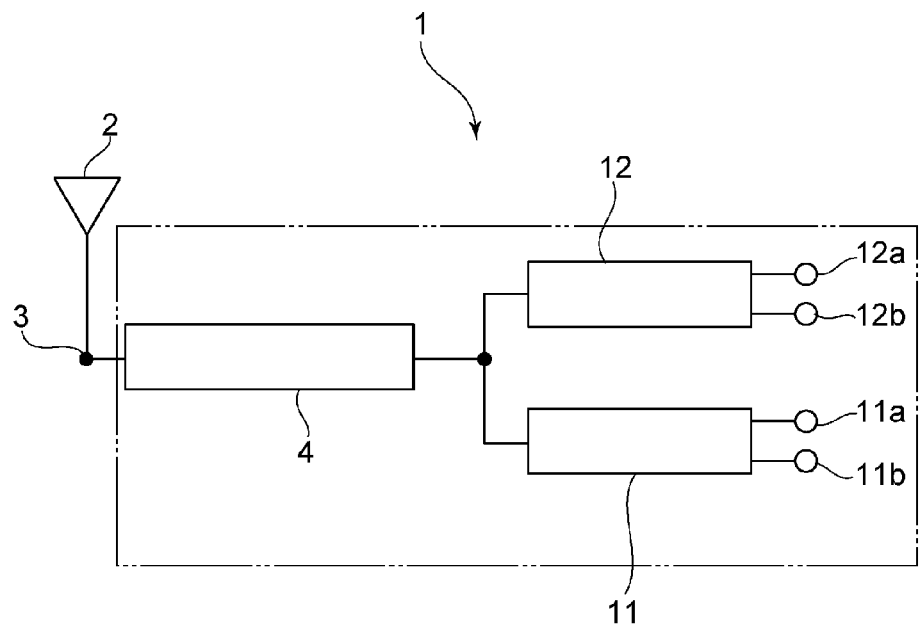
FIG. 2 is a block diagram of a splitter according to a preferred embodiment of the present invention.

FIG. 2 is a block diagram of a splitter according to a preferred embodiment of the present invention. A splitter 1 includes an antenna terminal 3 connected to an antenna 2. First and second duplexers 11 and 12 are connected to the antenna terminal 3 via an impedance matching circuit 4. The impedance matching circuit 4 is preferably defined by a known circuit that performs impedance matching. The impedance matching circuit 4 is not an essential component in the splitter 1 according to a preferred embodiment of the present invention.

In this preferred embodiment, the splitter 1 preferably is used in two communication systems, Band4 and Band25, for example. That is, the splitter 1 is able to perform transmission or reception at the same time in these two communication systems.

The first duplexer 11 is a Band4 duplexer, while the second duplexer 12 is a Band25 duplexer. The transmit band of Band4, that is, a first transmit band, is 1710 MHz to 1755 MHz, while the receive band of Band4, that is, a first receive band, is 2110 MHz to 2155 MHz. The transmit band of Band25, that is, a second transmit band, is 1850 MHz to 1915 MHz, while the receive band of Band25, that is, a second receive band, is 1930 MHz to 1995 MHz.

Accordingly, the second transmit band and the second receive band are positioned between the first transmit band and the first receive band.

When the frequency difference between the first transmit band and the second transmit band is represented by $\Delta f1$ and when the frequency difference between the second receive band and the first receive band is represented by $\Delta f2$, $\Delta f1=95$ MHz and $\Delta f2=115$ MHz in this preferred embodiment.

As shown in FIG. 2, the first duplexer 11 includes a first transmit terminal 11a and a first receive terminal 11b. Similarly, the second duplexer 12 includes a second transmit terminal 12a and a second receive terminal 12b. In a known splitter that achieves transmission or reception at the same time in Band4 and Band25, there is a problem in that a considerable loss occurs in a Band4 duplexer, that is, in a first duplexer having a first transmit band and a first receive band. In contrast, in the splitter 1 of this preferred embodiment, it is possible to significantly reduce the loss in the first duplexer 11. This will be clarified through a detailed explanation of the configurations of the first and second duplexers 11 and 12.

In this preferred embodiment, the first and second duplexers 11 and 12 include surface acoustic wave devices.

Figure 3:
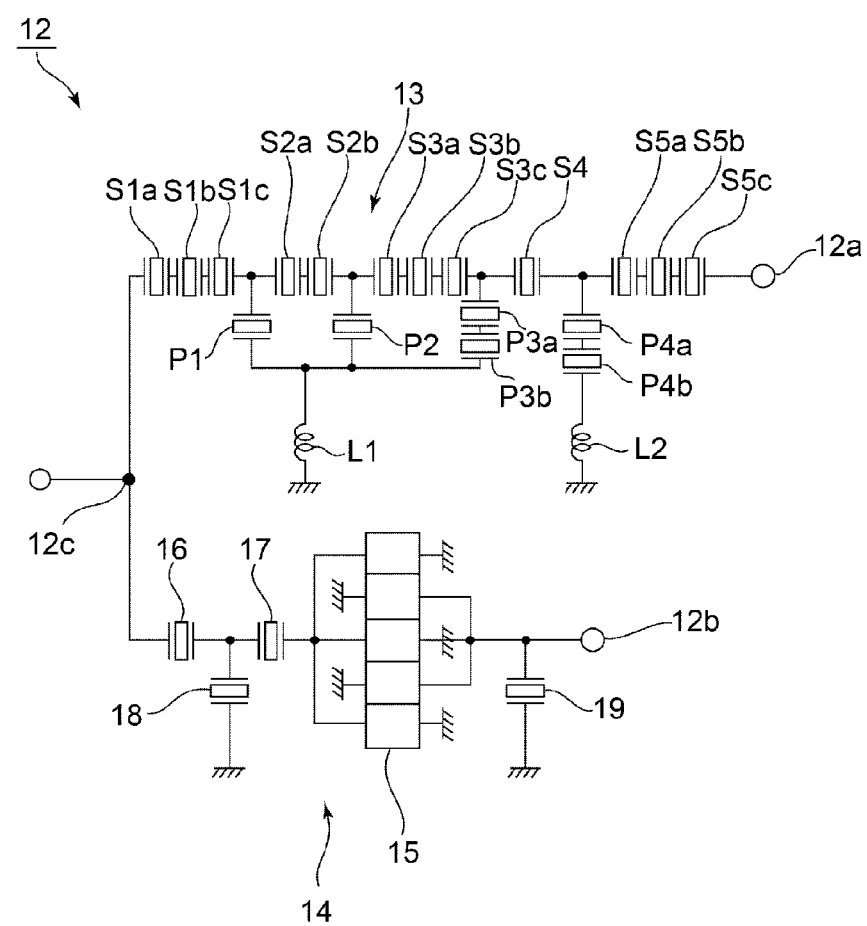
FIG. 3 is a circuit diagram illustrating a second duplexer of a splitter according to a preferred embodiment of the present invention.

FIG. 3 is a circuit diagram of the second duplexer 12. The second duplexer 12 includes a common connecting terminal 12c, which defines and functions as a second antenna terminal, and the above-described second transmit terminal 12a and second receive terminal 12b. A second transmit filter 13 is connected between the common connecting terminal 12c and the second transmit terminal 12a.

The second transmit filter 13 is a ladder filter including a plurality of surface acoustic wave resonators. More specifically, series arm resonators S1a through S1c, S2a and S2b, S3a through S3c, S4, and S5a through S5c are connected to each other in a direction from the common connecting terminal 12c to the second transmit terminal 12a.

A parallel arm resonator P1 is connected between a node between the series arm resonators S1c and S2a and a ground potential. A parallel arm resonator P2 is connected between a node between the series arm resonators S2b and S3a and the ground potential. Parallel arm resonators P3a and P3b connected in series with each other are disposed between a node between the series arm resonators S3c and S4 and the ground potential. An end portion of the parallel arm resonator P1 closer to the ground potential, an end portion of the parallel arm resonator P2 closer to the ground potential, and an end portion of the parallel arm resonator P3b closer to the ground potential are connected to a common connecting portion. Inductance L1 is connected between this common connecting portion and the ground potential. Parallel arm resonators P4a and P4b and inductance L2 connected in series with each other are connected between a node between the series arm resonators S4 and S5a and a ground potential.

The series arm resonators S1a through S5c and the parallel arm resonators P1 through P4b each include a surface acoustic wave resonator.

A second receive filter 14 is connected between the common connecting terminal 12c and the second receive terminal 12b. The second receive filter 14 includes a 5IDT longitudinally coupled resonator-type elastic wave filter 15. Surface acoustic wave resonators 16 and 17 are connected in series with each other between the longitudinally coupled resonator-type elastic wave filter 15 and the common connecting terminal 12c. A surface acoustic wave resonator 18 is connected between a node between the surface acoustic wave resonators 16 and 17 and a ground potential.

A surface acoustic wave resonator 19 is connected between an end portion of the longitudinally coupled resonator-type elastic wave filter 15 closer to the receive terminal and a ground potential.

Figure 1:
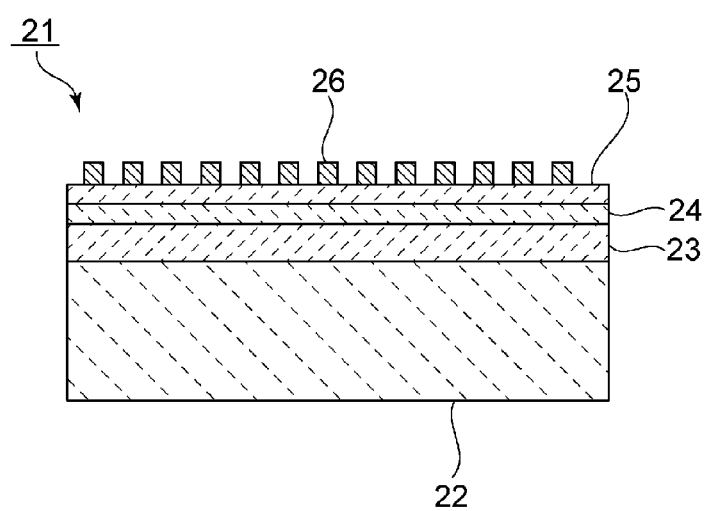
FIG. 1 is a schematic sectional view illustrating the structure of a second duplexer of a splitter according to a preferred embodiment of the present invention.

In this preferred embodiment, the second duplexer 12 includes a substrate with a multilayer structure in which a low acoustic velocity film and a high acoustic velocity film are stacked on each other under a piezoelectric film in this order from the top to bottom direction. FIG. 1 is a sectional view schematically illustrating such a structure of a surface acoustic wave device.

As shown in FIG. 1, a surface acoustic wave device 21 includes a support substrate 22. The support substrate 22 may be made of a suitable insulator or semiconductor. In this preferred embodiment, the support substrate 22 is made of Si, for example.

As a high acoustic velocity member, a high acoustic velocity film 23 through which transversal waves propagate at a relatively high velocity is stacked on the support substrate 22. A low acoustic velocity film 24 is stacked on the high acoustic velocity film 23. A piezoelectric film 25 is stacked on the low acoustic velocity film 24. IDT electrodes 26 are provided on the piezoelectric film 25. These IDT electrodes 26 correspond to IDT electrodes of the above-described surface acoustic wave resonators and longitudinally coupled resonator-type elastic wave filter.

In the specification, the high acoustic velocity member is a member through which bulk waves propagate at a higher acoustic velocity than elastic waves, such as surface waves and boundary waves, propagating through the piezoelectric film. The low acoustic velocity film is a film through which bulk waves propagate at a lower acoustic velocity than bulk waves propagating through the piezoelectric film.

As materials for the high acoustic velocity film 23 and the low acoustic velocity film 24, suitable insulating materials that satisfy the above-described relationships concerning the acoustic velocity may be used. Examples of such insulating materials are silicon oxide, silicon nitride, silicon oxynitride, aluminum nitride, aluminum oxide, and titanium oxide. In this preferred embodiment, the high acoustic velocity film 23 is made of AlN, and the low acoustic velocity film 24 is made of $SiO_2$, for example.

The piezoelectric film 25 may be formed of a suitable piezoelectric material. Examples of such a piezoelectric material are piezoelectric monocrystal such as $LiTaO_3$, $LiNbO_3$, and quarts and piezoelectric ceramics such as PZT.

The IDT electrodes 26 may be made of a suitable metal or alloy. Examples of such a metal and alloy are Cu, Al, Pt, Ti, W, Ag, an Ag—Pd alloy, and an AlCu alloy. The IDT electrodes 26 may be made of a multilayer metal film including multiple metal films stacked on each other.

A suitable protective film may be provided to cover the IDT electrodes 26.

In the surface acoustic wave device 21, surface acoustic waves excited by the IDT electrodes 26 propagate through the piezoelectric film 25. In this case, since the low acoustic velocity film 24 and the high acoustic velocity film 23 are stacked under the piezoelectric film 25, a leakage of surface acoustic waves in the downward direction is significantly reduced or prevented. Accordingly, energy of the surface acoustic waves is effectively enclosed within the piezoelectric film 25, thus making it possible to increase the Q factor.

In the splitter 1 of this preferred embodiment, since the second duplexer 12 includes the above-described surface acoustic wave device 21, the Q factor is increased in the second duplexer 12. Accordingly, concerning the frequency characteristics of the second duplexer 12, the reflectance in the first transmit band and in the first receive band is significantly improved, thus making it possible to decrease the loss in the first duplexer 11. This will be discussed in a greater detail later through illustration of experiments.

Figure 4:
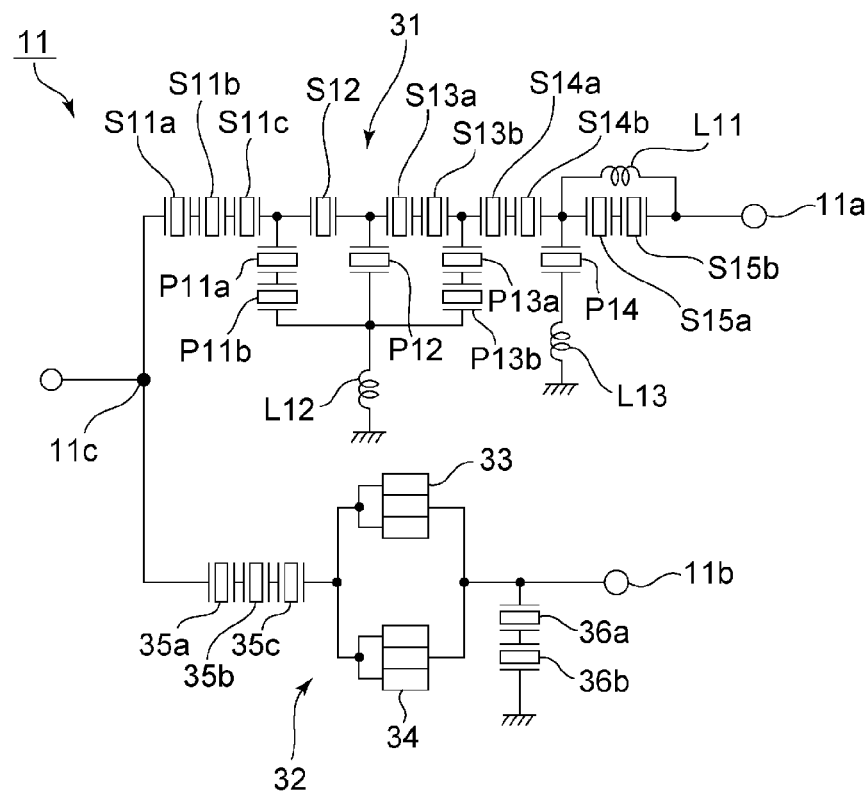
FIG. 4 is a circuit diagram illustrating a first duplexer of a splitter according to a preferred embodiment of the present invention.

FIG. 4 is a circuit diagram of the first duplexer 11. The first duplexer 11 includes a common connecting terminal 11c, which defines and functions as a second antenna terminal, and the above-described first transmit terminal 11a and first receive terminal 11b.

A first transmit filter 31 is connected between the common connecting terminal 11c and the first transmit terminal 11a. The first transmit filter 31 is a ladder filter. The first transmit filter 31 includes series arm resonators S11a through S15b.

Inductance L11 is connected in parallel with the series arm resonators S15a and S15b. Parallel arm resonators P11a and P11b are connected in series with each other between a node between the series arm resonators S11c and S12 and a ground potential. A parallel arm resonator P12 is connected between a node between the series arm resonators S12 and S13a and a ground potential. Parallel arm resonators P13a and P13b are connected in series with each other between a node between the series arm resonators S13b and S14a and a ground potential. Inductance L12 is connected between the ground potential and end portions of the parallel arm resonators P11b, P12, and P13b closer to the ground potential. A parallel arm resonator P14 is connected between a node between the series arm resonators S14b and S15a and a ground potential. Inductance L13 is connected between the ground potential and an end portion of the parallel arm resonator P14 closer to the ground potential.

A first receive filter 32 is connected between the common connecting terminal 11c and the first receive terminal 11b. The first receive filter 32 includes first and second longitudinally coupled resonator-type elastic wave filters 33 and 34. The first and second longitudinally coupled resonator-type elastic wave filters 33 and 34 are connected in parallel with each other. Surface acoustic wave resonators 35a through 35c are connected in series with each other between the input terminals of the first and second longitudinally coupled resonator-type elastic wave filters 33 and 34 and the common connecting terminal 11c. Surface acoustic wave resonators 36a and 36b are connected in series with each other between the output terminals of the first and second longitudinally coupled resonator-type elastic wave filters 33 and 34 and a ground potential.

In this preferred embodiment, the structure of the first duplexer 11 is also similar to that of the surface acoustic wave device 21 shown in FIG. 1. Accordingly, in the first duplexer 11, too, the Q factor is increased. However, the first duplexer 11 may not necessarily have the structure of the surface acoustic wave device 21. That is, the first duplexer 11 may be defined by a surface acoustic wave device of a structure without a low acoustic velocity film and a high acoustic velocity film.

As discussed above, in the splitter 1 of this preferred embodiment, the reflectance in the first transmit band and in the first receive band is enhanced in the second duplexer 12, thus making it possible to decrease the loss. This will be discussed below through illustration of specific experiments.

As non-limiting examples of various preferred embodiments of the present invention, the duplexers of the above-described preferred embodiment were preferably formed in the following manner.

As the support substrate 22, a Si substrate having a thickness of 200 μm was used. As the high acoustic velocity film 23, an AlN film having a thickness of 1345 nm was used. As the low acoustic velocity film 24, a $SiO_2$ film having a thickness of 670 nm was used. As the piezoelectric film 25, a $LiTaO_3$ film having a thickness of 650 nm and a cut angle of 55° was used. As the IDT electrodes 26, a multilayer metal film constituted by a Ti film having a thickness of 12 nm and an AlCu film having a thickness of 162 nm and containing 1 Cu weight % stacked on each other in this order was used. A $SiO_2$ film having a thickness of 25 nm was formed on the IDT electrodes as a protective film.

The splitter 1 including the first and second duplexers 11 and 12 provided in the above-described multilayer structure was fabricated. The specifications of the first and second duplexers 11 and 12 are as follows.

Details of the series arm resonators S1a through S5c and the parallel arm resonators P1 through P4b are those indicated in Table 1.

TABLE 1

|  | S5a to S5c | P4a, P4b | S4 | P3a, P3b | S3a to S3c | P2 | S2a, S2b | P1 | S1a to S1c |
|---|---|---|---|---|---|---|---|---|---|
| IDT wavelength (μm) | 2.0249 | 2.1093 | 1.9213 | 2.1115 | 2.0224 | 2.113 | 2.0472 | 2.1244 | 2.0249 |
| Reflector wavelength (μm) | ditto | ditto | ditto | Ditto | ditto | ditto | ditto | ditto | 2.0449 |
| Interdigital width (μm) | 30.62 | 68.23 | 28.94 | 83.25 | 30.56 | 66.29 | 37.44 | 65 | 31.6 |
| Number of pairs of electrode fingers of IDT | 288 | 79 | 235 | 73 | 120 | 70 | 262 | 74 | 258 |
| Number of electrode fingers of reflector | 21 | 21 | 21 | 21 | 21 | 21 | 21 | 21 | 21 |
| Duty | 0.5 | 0.5 | 0.5 | 0.5 | 0.5 | 0.5 | 0.5 | 0.5 | 0.5 |

The specifications of the 5IDT longitudinally coupled resonator-type elastic wave filter 15 are those indicated in Table 2 and Table 3. In Table 2, IDTc is the central IDT, IDTa and IDTe are IDTs located at both ends, IDTb is an IDT disposed between IDTa and IDTc, and IDTd is an IDT disposed between IDTc and IDTe. Moreover, "main portion" indicates electrode fingers other than a narrow-pitch portion, and "narrow-pitch portion" indicates narrow-pitch electrode fingers.

TABLE 2

| Wavelength (μm) | | |
|---|---|---|
| | Reflector | 1.9855 |
| | IDTa and IDTe main portion | 1.986 |
| | IDTa and IDTe narrow-pitch portion | 1.8155 |
| | IDTb and IDTd narrow-pitch portion (outer) | 1.8155 |
| | IDTb and IDTd main portion | 1.9355 |
| | IDTb and IDTd narrow-pitch portion (inner) | 1.8605 |
| | IDTc narrow-pitch portion | 1.8945 |
| | IDTc main portion | 1.9765 |

TABLE 3

| Number of pairs of electrode fingers | |
|---|---|
| IDTa and IDTe main portion | 20.5 |
| IDTa and IDTe narrow-pitch portion | 1.5 |
| IDTb and IDTd narrow-pitch portion (outer) | 1 |
| IDTb and IDTd main portion | 13.5 |
| IDTb and IDTd narrow-pitch portion (inner) | 3.5 |
| IDTc narrow-pitch portion | 4.5 |
| IDTc main portion | 20 |

The number of pairs of electrode fingers, interdigital width, and duty of the surface acoustic wave resonators 16 through 19 are those indicated in Table 4.

TABLE 4

| Surface acoustic wave resonator | 16 | 18 | 17 | 19 |
|---|---|---|---|---|
| IDT wavelength (μm) | 1.917 | 1.917 | 1.917 | 1.9885 |
| Reflector wavelength (μm) | " | " | " | " |
| Interdigital width (μm) | 28.95 | 28.95 | 28.95 | 60.78 |
| Number of pairs of electrode fingers of IDT | 80 | 80 | 80 | 82 |
| Number of electrode fingers of reflector | 29 | 29 | 29 | 21 |
| Duty | 0.5 | 0.5 | 0.5 | 0.5 |

Details of the series arm resonators S11*a* through S15*b* and the parallel arm resonators P11*a* through P14 are those indicated in Table 5.

TABLE 5

|  | S15a, S15b | P14 | S14a, S14b | P13a, P13b | S13a, S13b | P12 | S12 | P11a, P11b | S11a to S11c |
|---|---|---|---|---|---|---|---|---|---|
| IDT wavelength (μm) | 2.3108 | 2.3349 | 2.236 | 2.3289 | 2.2428 | 2.3227 | 2.2295 | 2.3224 | 2.226 |
| Reflector wavelength (μm) | 2.356 | 2.3349 | 2.2342 | 2.3381 | 2.3083 | 2.3449 | 2.3259 | 2.3341 | 2.3164 |
| Interdigital width (μm) | 80.7 | 41.9 | 55.2 | 41.8 | 50.9 | 33.1 | 46.2 | 70.3 | 52.9 |
| Number of pairs of electrode fingers of IDT | 154 | 129 | 114 | 149 | 146 | 100 | 141 | 77 | 166 |
| Number of electrode fingers of reflector | 14 | 18 | 14 | 18 | 14 | 18 | 14 | 18 | 14 |
| Duty | 0.5 | 0.5 | 0.5 | 0.5 | 0.5 | 0.5 | 0.5 | 0.5 | 0.5 |

Details of the first and second longitudinally coupled resonator-type elastic wave filters 33 and 34 are those indicated in Table 6 and Table 7.

TABLE 6

| | | |
|---|---|---|
| Wavelength (μm) | Reflector | 1.8926 |
| | Main portions of IDTs at both ends | 1.8702 |
| | Narrow-pitch portions of IDTs at both ends | 1.7737 |
| | Narrow-pitch portion of central IDT | 1.7651 |
| | Main portion of central IDT | 1.8742 |

TABLE 7

| Number of pairs of electrode fingers | |
|---|---|
| Main portions of IDTs at both ends | 19 |
| Narrow-pitch portions of IDTs at both ends | 2.5 |
| Narrow-pitch portion of central IDT | 3 |
| Main portion of central IDT | 24 |

Details of the surface acoustic wave resonators 35a through 35c, 36a, and 36b are those indicated in Table 8.

TABLE 8

| Surface acoustic wave resonator | 35a to 35c | 36a, 36b |
|---|---|---|
| IDT wavelength (μm) | 1.8378 | 1.9049 |
| Reflector wavelength (μm) | " | " |
| Interdigital width (μm) | 30 | 61 |
| Number of pairs of electrode fingers of IDT | 180 | 110 |
| Number of electrode fingers of reflector | 58 | 38 |
| Duty | 0.5 | 0.5 |

For comparison, a splitter of a comparative example was fabricated in a manner similar to the above-described example, except that surface acoustic wave devices without the above-described high acoustic velocity film and low acoustic velocity film were used. That is, as the multilayer structure of the surface acoustic wave devices, a LiTaO$_3$ film having a thickness of 600 nm and a cut angle of 55° was stacked on a support substrate, and then, IDT electrodes were formed on the LiTaO$_3$ film in a manner similar to the above-described example.

Figure 5:
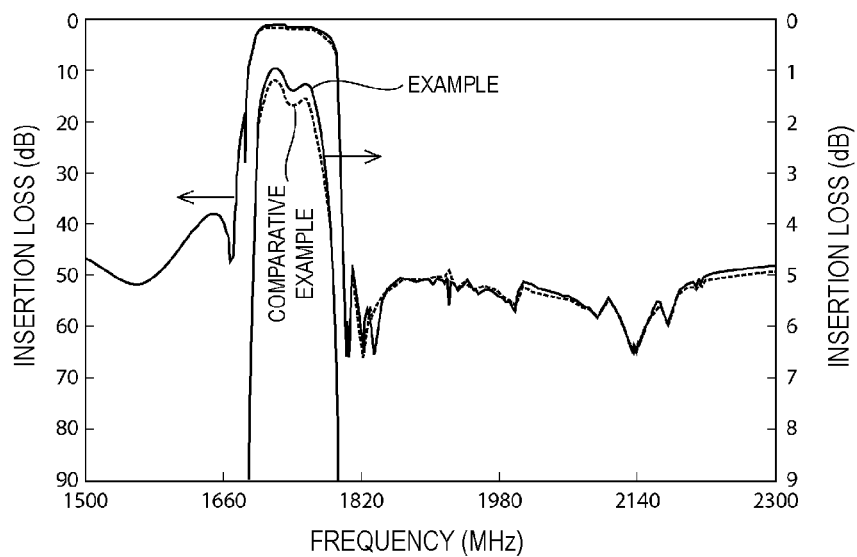
FIG. 5 is a graph illustrating attenuation frequency characteristics of first transmit filters of first duplexers in an example and in a comparative example.
Figure 6:
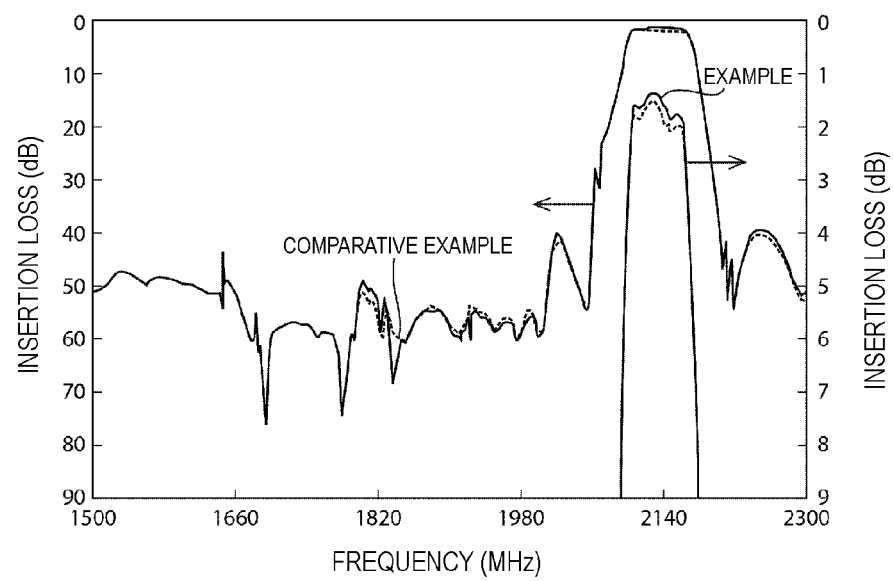
FIG. 6 is a graph illustrating attenuation frequency characteristics of first receive filters of first duplexers in the example and in the comparative example.

In FIGS. 5 and 6, the solid line indicates the result of the example, while the broken line indicates the result of the comparative example. FIG. 5 illustrates attenuation frequency characteristics of the first transmit filter of the first duplexer. FIG. 6 illustrates attenuation frequency characteristics of the first receive filter of the first duplexer.

As is seen from FIGS. 5 and 6, the insertion loss in the first transmit band and in the first receive band is reduced to a smaller level in the example than in the comparative example. In particular, the insertion loss in the transmit band is effectively reduced. The reason for this may be that the reflectance in the first transmit band and in the first receive band is enhanced in the second duplexer 12. This will be explained below with reference to FIGS. 7 and 8.

Figure 7:
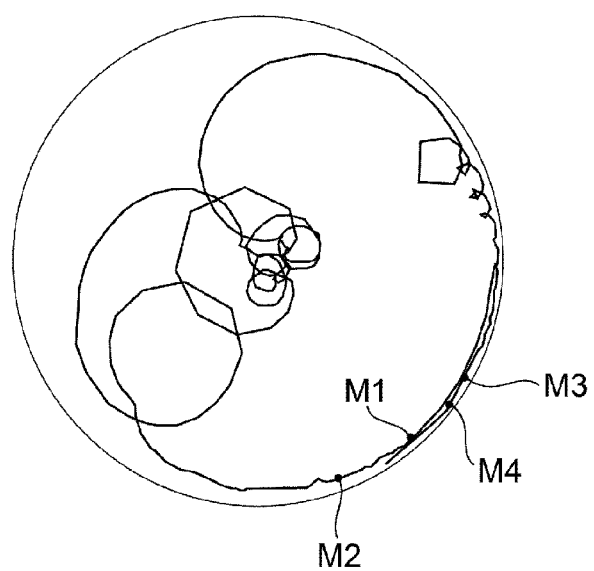
FIG. 7 is a Smith chart illustrating the impedance at an antenna terminal of a second duplexer of a splitter according to a preferred embodiment of the present invention.
Figure 8:
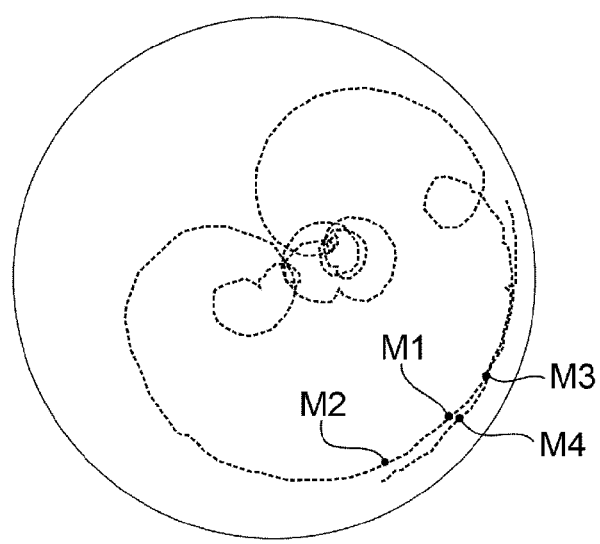
FIG. 8 is a Smith chart illustrating the impedance at the antenna terminal of a second duplexer of a splitter of a comparative example.

FIG. 7 is a Smith chart illustrating the impedance at the antenna terminal of the second duplexer in the above-described example. FIG. 8 is a Smith chart illustrating the impedance at the antenna terminal of the second duplexer in the splitter of the above-described comparative example.

In FIGS. 7 and 8, markers M1, M2, M3, and M4 indicate the positions of 1710 MHz, 1755 MHz, 2110 MHz, and 2155 MHz, respectively. That is, the transmit band of Band4, that is, the first transmit band, is located between marker M1 and marker M2, while the first receive band, that is, the receive band of Band4, is located between marker M3 and marker M4.

Upon comparing FIG. 7 with FIG. 8, it is clearly seen that, in the above-described example in comparison with the comparative example, both in the first receive band and in the first transmit band, the curves in the impedance Smith chart are close to the outer peripheral edge, and thus, the reflectance approximates to 1. That is, in the above-described example in comparison with the comparative example, the reflectance in the first transmit band and in the first receive band is enhanced in the second duplexer. Accordingly, signals in the first transmit band and in the first receive band are unlikely to enter the second duplexer 12. Because of this reason, loss is effectively reduced in the transmission characteristics and reception characteristics of the first duplexer 11, as shown in FIGS. 5 and 6.

In the above-described example, since the second duplexer 12 has the multilayer structure shown in FIG. 1, as discussed above, the Q factor is increased, and because of this reason, the reflectance in the first transmit band and in the first receive band is enhanced.

Accordingly, in this preferred embodiment, the loss in the first transmit band and in the first receive band of the first duplexer 11 is effectively reduced. It is thus possible to considerably reduce the loss in the splitter 1 which supports Band25 and Band4 whose Δf1 and Δf2 are small, in comparison with a known splitter.

The problem with an increase in the loss in the first duplexer 11 as discussed above is particularly noticeable when Δf1 and Δf2 are small, that is, when the differences in the pass band between the first duplexer and the second duplexer are small. If there are great differences in the pass band between the first duplexer and the second duplexer, the reflectance approximates to 1.

Preferably, Δf1 is greater than about 1% of the lower limit frequency of the second transmit band, and Δf2 is greater than about 1% of the upper limit frequency of the second receive band. This will be explained below with reference to FIGS. 9 and 10.

Figure 9:
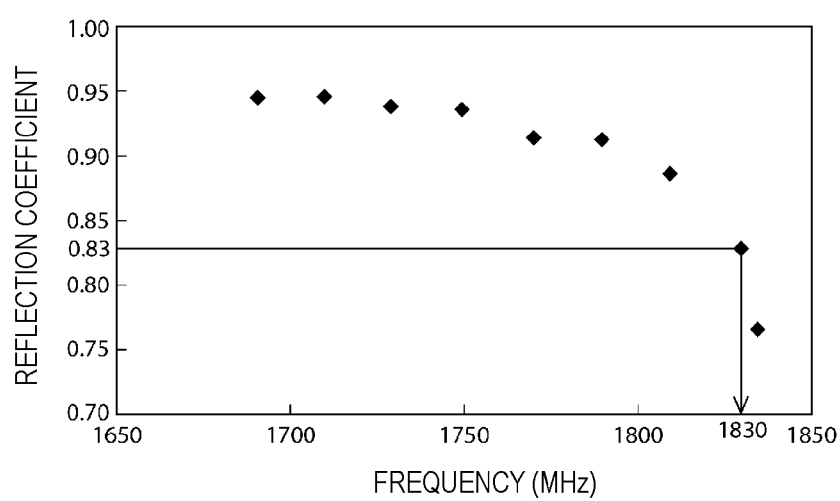
FIG. 9 is a graph illustrating the relationship between the frequency and the reflection coefficient of a second transmit filter of a splitter according to a preferred embodiment of the present invention.

FIG. 9 is a graph illustrating the relationship between the frequency and the reflection coefficient obtained from the impedance Smith chart of the second duplexer in the above-described preferred embodiment. In the above-described comparative example, the maximum reflection coefficient in 1650 to 1850 MHz is 0.83. In contrast, as is seen from FIG. 9, in the above-described preferred embodiment, the reflection coefficient is increased to 0.83 or higher in the frequency range of 1830 MHz and lower. Accordingly, at the frequency lower than 1830 MHz, the reflection coefficient can be increased to a higher level than in the comparative example. The lower limit frequency of the second transmit band is 1850 MHz. Thus, if Δf1 is set to be greater than {(1850−1830)/1850}×100(%)=1.08(%) of the lower limit frequency of the second transmit band, the loss may be reduced even more effectively.

Figure 10:
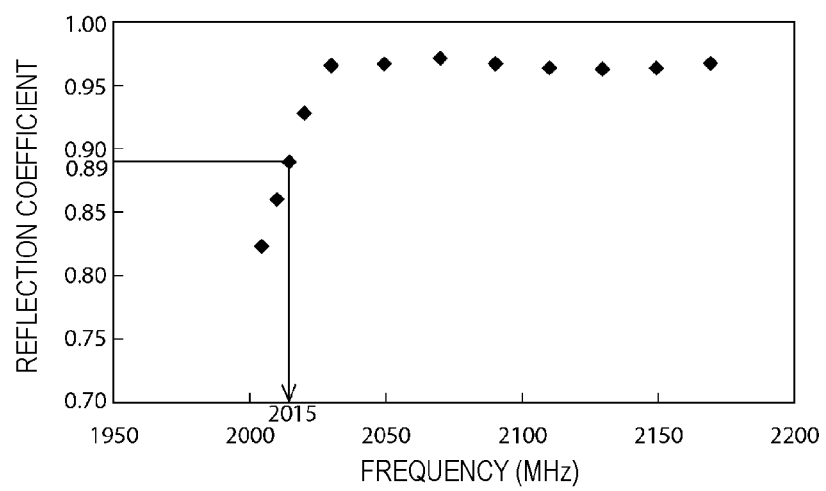
FIG. 10 is a graph illustrating the relationship between the frequency and the reflection coefficient of a second receive filter of a splitter according to a preferred embodiment of the present invention.

FIG. 10 is a graph also illustrating the relationship between the frequency and the reflection coefficient obtained from the impedance Smith chart of the second duplexer in the above-described preferred embodiment. In the comparative example, the maximum reflection coefficient in a higher frequency range of 1950 MHz to 2200 MHz is 0.89. As is seen from FIG. 10, in the example, the reflection coefficient at 2015 MHz is 0.89. Thus, if Δf2 is set to be greater than {(2015−1995)/1995}×100(%)=1.00(%) of the upper limit frequency of the second receive band, the reflection coefficient is able to be increased to about 0.89 or greater.

Accordingly, by setting Δf2 to be greater than about 1% of the upper limit frequency of the second receive band, the loss in the higher frequency range is reduced even more effectively.

The upper limits of Δf1 and Δf2 are not restricted technically. However, if various communication standards are considered, it is desirable that the upper limits of Δf1 and Δf2 be about 50% of the lower limit frequency of the second transmit band and the upper limit frequency of the second receive band, respectively.

Figure 11:
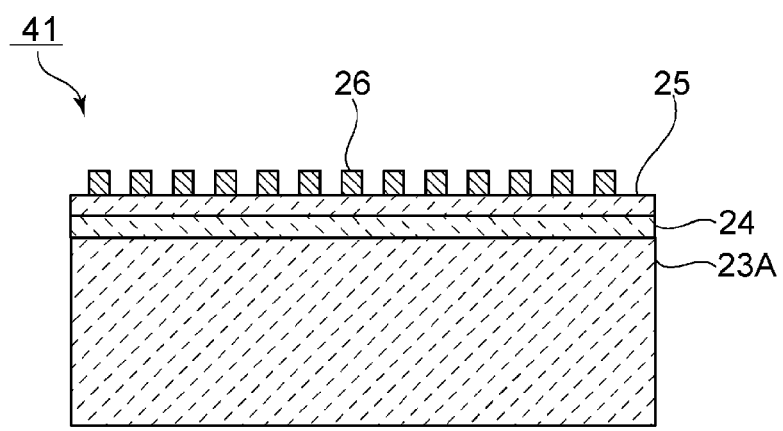
FIG. 11 is a schematic sectional view illustrating the structure of a second duplexer of a splitter according to another preferred embodiment of the present invention.

In the above-described preferred embodiment, the high acoustic velocity film 23, which defines and functions as a high acoustic velocity member, is stacked on the support substrate 22, as shown in FIG. 1. Instead of this structure, a high acoustic velocity support substrate 23A, which defines and functions as a high acoustic velocity member, may be used, as shown in FIG. 11. In this case, the support substrate 22 may be omitted. Regarding the material for the high acoustic velocity support substrate 23A, a material similar to that used for the high acoustic velocity film 23 may be used.

A surface acoustic wave device 41 shown in FIG. 11 is similar to the surface acoustic wave device 21 shown in FIG. 1, except that the high acoustic velocity support substrate 23A is used.

In the above-described preferred embodiment, the first and second transmit filters are ladder circuit filters, and the first and second receive filters are longitudinally coupled resonator-type elastic wave filters. However, the circuit configurations of the transmit filters and the receive filters are not restricted to these configurations. The transmit filters and the receive filters may include elastic wave filters of various circuit configurations using elastic waves. Moreover, instead of surface acoustic waves, boundary acoustic waves may be used.

The transmit bands and the receive bands of the first and second duplexers are not restricted to Band4 and Band25, as discussed above. It is possible to provide a splitter which supports various multiple bands according to various preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A splitter comprising:
a first duplexer including a first antenna terminal connected to an antenna, a first transmit filter connected to the first antenna terminal and including a first transmit band, and a first receive filter including a first receive band; and
a second duplexer including a second antenna terminal connected to the antenna, a second transmit filter connected to the second antenna terminal and including a second transmit band, and a second receive filter including a second receive band; wherein
the second transmit band and the second receive band are in a frequency range between the first transmit band and the first receive band; and
each of the second transmit filter and the second receive filter of the second duplexer includes an elastic wave filter, and the elastic wave filter includes a high acoustic velocity member through which bulk waves propagate at a higher acoustic velocity than elastic waves propagating through a piezoelectric film, a low acoustic velocity film which is stacked on top of the high acoustic velocity member and through which bulk waves propagate at a lower acoustic velocity than bulk waves propagating through the piezoelectric film, the piezoelectric film stacked on top of the low acoustic velocity film, and an IDT electrode stacked on top of the piezoelectric film.

2. The splitter according to claim 1, wherein
the high acoustic velocity member is a high acoustic velocity film; and
the splitter further comprises a support substrate on top of which the high acoustic velocity film is stacked.

3. The splitter according to claim 1, wherein the high acoustic velocity member is a high acoustic velocity support substrate.

4. The splitter according to claim 1, wherein, when a frequency difference between the first transmit band and the second transmit band is represented by Δf1 and when a frequency difference between the second receive band and the first receive band is represented by Δf2, Δf1 is greater than about 1% of a lower limit frequency of the second transmit band, and Δf2 is greater than about 1% of an upper limit frequency of the second receive band.

5. The splitter according to claim 1, wherein the first and second transmit filters are ladder circuit filters, and the first and second receive filters are longitudinally coupled resonator-type elastic wave filters.

6. The splitter according to claim 1, wherein the first duplexer is a Band4 duplexer, and the second duplexer is a Band25 duplexer.

7. The splitter according to claim 1, further comprising an impedance matching circuit that connects the first and second duplexers to the antenna.

8. The splitter according to claim 1, wherein the splitter is operational in two communication systems and performs transmission and reception simultaneously in the two communication systems.

9. The splitter according to claim 1, wherein the first and second duplexers include surface acoustic wave devices.

10. The splitter according to claim 1, wherein the second transmit filter is a ladder filter including a plurality of surface acoustic wave resonators.

11. The splitter according to claim 1, wherein the second receive filter includes a 5-IDT longitudinally coupled resonator-type elastic wave filter.

12. The splitter according to claim 1, wherein the second duplexer includes a multilayer substrate including a low acoustic velocity film and a high acoustic velocity film stacked on each other under a piezoelectric film in this order from a top to bottom direction.

13. The splitter according to claim 1, wherein a protective film is provided to cover the IDT electrode.

14. The splitter according to claim 1, wherein first transmit filter is a ladder filter including a plurality of series arm resonators.

15. The splitter according to claim 1, wherein the first transmit filter includes first and second longitudinally coupled resonator-type elastic wave filters.

* * * * *